United States Patent
Lee

(10) Patent No.: US 6,878,637 B2
(45) Date of Patent: Apr. 12, 2005

(54) METHOD FOR FABRICATING SEMICONDUCTOR DEVICE CAPABLE OF IMPROVING PROCESS MARGIN OF SELF ALIGN CONTACT

(75) Inventor: Sung-Kwon Lee, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 146 days.

(21) Appl. No.: 10/309,009

(22) Filed: Dec. 4, 2002

(65) Prior Publication Data

US 2003/0119329 A1 Jun. 26, 2003

(30) Foreign Application Priority Data

Dec. 14, 2001 (KR) .................................... 2001-0079255

(51) Int. Cl.[7] .......................................... H01L 21/302
(52) U.S. Cl. ...................... 438/725; 438/714; 438/723; 438/734; 438/736; 438/740; 134/1.2
(58) Field of Search ........................... 134/1.2; 438/714, 438/725, 723, 734, 736, 740

(56) References Cited

U.S. PATENT DOCUMENTS

| | | | | |
|---|---|---|---|---|
| 5,565,384 A | * | 10/1996 | Havemann | 438/702 |
| 6,019,906 A | * | 2/2000 | Jang et al. | 216/2 |
| 6,207,583 B1 | * | 3/2001 | Dunne et al. | 438/725 |
| 6,287,905 B2 | * | 9/2001 | Kim et al. | 438/197 |
| 6,352,931 B1 | * | 3/2002 | Seta et al. | 438/700 |
| 6,432,833 B1 | | 8/2002 | Ko | |
| 6,607,955 B2 | * | 8/2003 | Lee | 438/256 |
| 2002/0034877 A1 | * | 3/2002 | Shin et al. | 438/694 |

FOREIGN PATENT DOCUMENTS

| JP | 2000-49112 A | 2/2000 |
|---|---|---|
| JP | 2001-230387 A | 8/2001 |
| JP | 2002-110819 A | 4/2002 |

* cited by examiner

Primary Examiner—George A. Goudreau
(74) Attorney, Agent, or Firm—Birch, Stewart, Kolasch & Birch, LLP

(57) ABSTRACT

The present invention provides a method for fabricating a semiconductor device capable of minimizing losses of a gate electrode and a hard mask during a self align contact (SAC) formation process. For this effect, the present invention includes the steps of: forming a plurality of conductive patterns on a substrate; forming hard masks on the conductive patterns; forming an organic based dielectric layer on the substrate including the conductive patterns and the hard mask; forming an oxide based insulation layer on the organic based dielectric layer; selectively etching the insulation layer so as to expose the organic based dielectric layer allocated between the conductive patterns; and selectively etching the exposed organic based dielectric layer to form a contact hole that exposes the surfaces of the substrate between the conductive patterns with an $O_2$ gas as a main etching gas.

12 Claims, 2 Drawing Sheets

METHOD FOR FABRICATING SEMICONDUCTOR DEVICE CAPABLE OF IMPROVING PROCESS MARGIN OF SELF ALIGN CONTACT

FIELD OF THE INVENTION

The present invention relates to a method for fabricating a semiconductor device; and, more particularly, a method for fabricating a semiconductor device capable of providing an appropriate approach for improving a process margin of a self align contact (SAC) in a hole type with the use of an organic material with a low dielectric constant (hereinafter referred as to low-k).

DESCRIPTION OF RELATED ARTS

It is difficult to stably obtain margins of a pattern formation process that uses photoresist and overlay accuracy through the improvement of integration of a semiconductor device. Hence, a process for forming a self align contact (hereinafter referred as to SAC) has been developed to solve the above problems. The SAC formation process is a main cause of reducing costs since it uses a material already deposited for an etching process instead of using an additional mask when going through a patterning procedure. Also, the SAC formation process uses many different types of techniques to attain the mentioned advantage; however, use of a nitride film as an etching prevention layer is a commonly employed technique.

Figure 1:
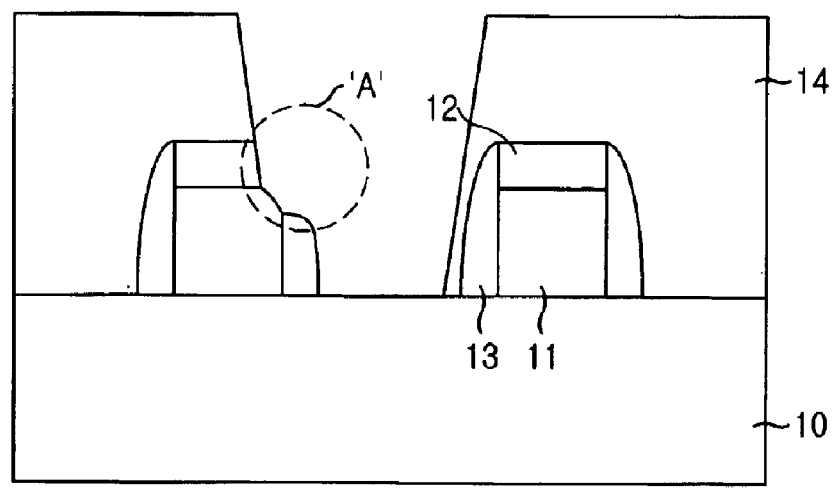

FIG. 1 is a cross-sectional view showing a SAC formation process that uses a nitride film as an etching prevention layer. A gate electrode 11 is formed on a substrate 10 and spacers 13 are formed on the lateral sides of the gate electrode. On top of the gate electrode 11, a nitride based etching prevention layer, i.e., a hard mask 12, is formed for preventing loss of the gate electrode 11 during the SAC process. The dotted circle 'A' in FIG. 1 represents the loss of the gate electrode 11 and the hard mask 12 during the SAC formation process for forming contact plugs such as a storage node and a bit line after depositing an inter-layer insulation layer 14 on top of the above described structure. Such a loss, expressed as 'A' in FIG. 1, is inevitable when proceeding with an etching process in the case where an impurity junction at the bottom of the substrate 10 is set to be a basis for target etching during the SAC formation process.

In other words, over etching is carried out to run electric circuits to the bottom layers during the etching process. However, conductive layers including the gate electrode 11 and so forth are exposed to continuous attacks of etching in an opened state, resulting in the inducement of a short circuit with conductive materials of a subsequent contact hole. This inducement ultimately causes degradation of electronic properties of the semiconductor device as well as a reduction in production yields.

Accordingly, such etching condition should have a high degree of an etching selection ratio in order to solve the above problems caused by over etching. However, it is practically very difficult to develop such an etching condition.

SUMMARY OF THE INVENTION

It is, therefore, an object of the present invention to provide a method for fabricating a semiconductor device capable of providing an appropriate approach for minimizing losses of a gate electrode and a hard mask with a relatively simple manufacturing process when forming a self align contact (SAC).

In accordance with an aspect of the present invention, there is provided a method for fabricating a semiconductor device, including the steps of: forming a plurality of conductive patterns on a substrate; forming hard masks on the conductive patterns; forming an organic based dielectric layer on the substrate including the conductive patterns and the hard mask; forming an oxide based insulation layer on the organic based dielectric layer; selectively etching the insulation layer so as to expose the organic based dielectric layer allocated between the conductive patterns; and selectively etching the exposed organic based dielectric layer to form a contact hole that exposes the surfaces of the substrate between the conductive patterns, using an $O_2$ gas as a main etching gas.

In accordance with another aspect of the present invention, there is a provided a method for fabricating a semiconductor device, including the steps of: forming a plurality of conductive patterns on a substrate; forming hard masks on the conductive patterns; forming an organic based dielectric layer on the substrate including the conductive patterns and the hard mask; forming an oxide based insulation layer on the organic based dielectric layer; forming a photoresist pattern defining contact holea on the insulation layer; etching the insulation layer by using the photoresist pattern as an etching mask so as to expose the organic based dielectric layer allocated between the conductive patterns; and selectively etching the exposed organic based dielectric layer to form a contact hole that exposes the surfaces of the substrate between the conductive patterns with an $O_2$ gas as a main etching gas and simultaneously moving the photoresist patterns.

In accordance with another aspect of the present invention, there is provided an effect of preventing losses of a gate electrode and a hard mask and simultaneously removing a photoresist pattern during SAC etching procedures through the course of: firstly, depositing an organic based low dielectric layer prone to be etched with $O_2$ gas and performing an etch back process; filling inter-spaces of the gate electrode; depositing boro phospho silicate glass (BPSG) and so forth to form an insulation layer; using fluorinated gas to temporarily stop the etching process at the low dielectric layer during the etching process for forming the SAC; and forming a contact hole through the use of $O_2$ gas containing a small quantity of fluoride.

BRIEF DESCRIPTION OF THE DRAWING(S)

Figure 2A:
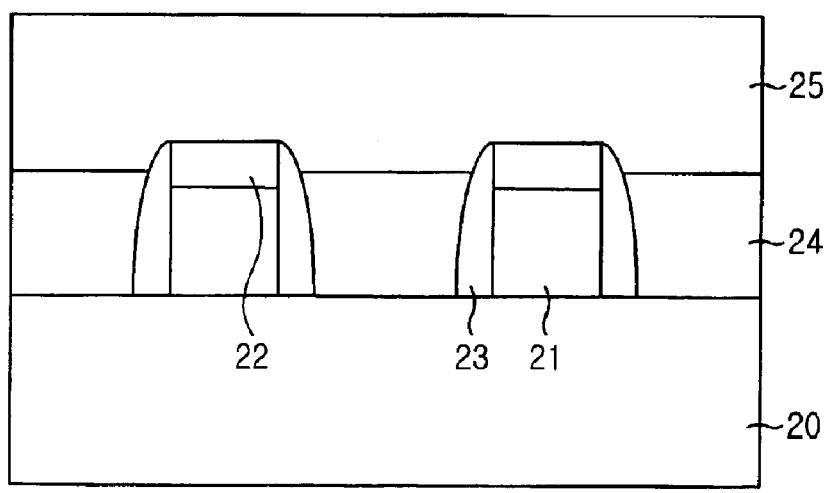
Figure 2B:
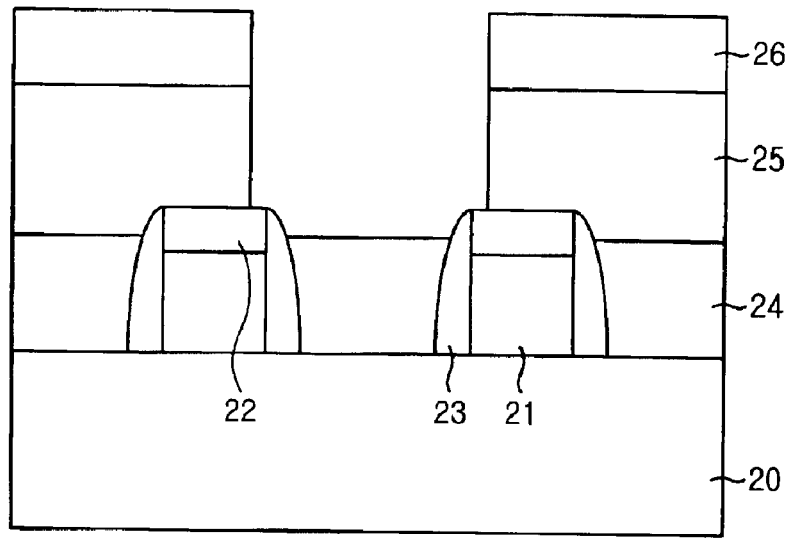
Figure 2C:
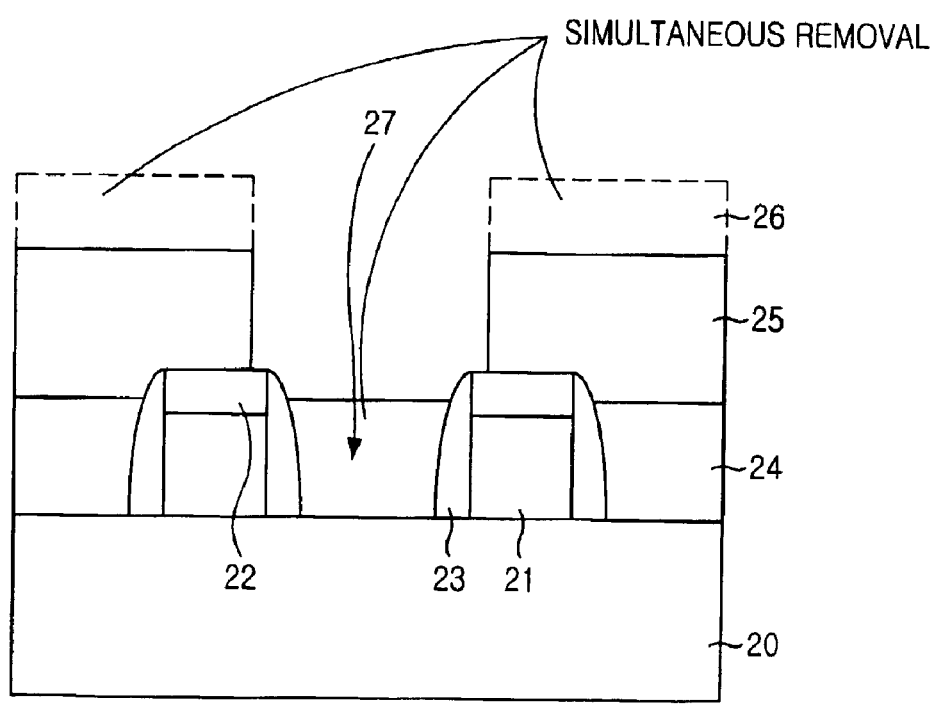

The above and other objects and features of the present invention will become apparent from the following description of the preferred embodiments given in conjunction with the accompanying drawings, in which:

FIG. 1 is a cross-sectional view showing a self align contact (SAC) formation process by using a nitride film as an etching prevention layer in accordance with a prior art; and FIGS. 2A to 2C are cross-sectional views illustrating a manufacturing process for fabricating a semiconductor device in accordance with a preferred embodiment of the present invention.

DETAILED DESCRIPTION OF THE INVENTION

Other objects and aspects of the invention will become apparent from the following description of the embodiments with reference to the accompanying drawings, which is set forth hereinafter.

FIGS. 2A to 2C are cross-sectional views depicting a self align contact (hereinafter referred as to SAC) formation process of a semiconductor device in accordance with a preferred embodiment of the present invention.

First of all, a number of conductive patterns are formed on a substrate 20 in which various elements for constructing the semiconductor device are already formed. The conductive pattern includes a bit line or a gate electrode and so forth. Hereinafter, the gate electrode will be an exemplary conductive pattern and further detailed explanation for this preferred embodiment of the present invention will be provided in the following.

Concretely, an oxide based gate insulation layer (not shown), a conductive film for use of the gate electrode with a single or mixtures of polysilicon, tungsten, or tungsten silicide and so forth and a hard mask 22 that uses a silicon nitride film or a silicon oxide nitride film and so forth are sequentially deposited and a photo-etching process is performed with use of a gate electrode mask to form the gate electrode 21.

Next, deposition of an insulation layer for use of a spacer for protecting lateral sides of the gate electrode 21 is instigated, and then, spacers 23 are formed on the lateral sides of the gate electrode 21 and the hard mask 22 through an etch back process. At this time, a thickness of the spacer 23 is arranged in a range from 100 Å to 100 Å through the use of a silicon nitride film or a silicon oxide nitride film.

Continuously, an organic low dielectric substance selected from a group consisting of hybrid-organic-siloxane-polymer (HOSP), silica of low dielectric constant, polymers based on divinyl siloxane bis-benzocyclobutene (DVS-bis-BCB), benzocyclobutene (BCB), fluorinated polyimide (FPI), nanoporous polymeric materials, poly arylene ether (PAE), methylsilsesquioxane (MSQ) and polytetrafluoroethylene (PTFE) is used to be deposited to sufficiently fill spaces between the gate electrode 21. After this deposition, the etch back procedure is conducted until the thickness of the deposited layer is obtained in the range between −500 Å to 500 Å.

An insulation layer 25 is then formed on a low dielectric layer 24 through the use of boro phospho silicate glass (BSPG), boro silicate glass (BSG), phospho silicate glass (PSG), advanced planarization layer (APL) or high density plasma (HDP) oxide film.

Next, as shown in FIG. 2B, a photoresist pattern 26 is formed for fabricating contact holes on the insulation layer 25 and a selective etching process, in which the photoresist pattern 26 acts as an etching mask, etches the insulation layer 25 so as to expose the low dielectric layer 24. Herein, a fluorinated plasma generally used in the SAC formation process, e.g., $C_2F_4$, $C_2F_6$, $C_3F_8$, $C_4F_6$, $C_5F_8$ or $C_5F_{10}$, is the major etching gas and a gas such as $CH_2F_2$, $C_3HF_5$, or $CHF_3$ and so forth is added to produce a polymer during the SAC formation process. In this case, an inactive gas, e.g., He, New, Ar or Xe is used as a carrier gas.

As illustrated in FIG. 2C, the low dielectric layer 24 is selectively etched to form a contact hole 27 that exposes a surface of the substrate 20. Herein, $O_2$ is used as the main etching gas.

Meanwhile, the above-described organic based low dielectric layer 24 shows a similarity in properties of the film with the photoresist pattern 26, and thus, the photoresist pattern 26 is simultaneously removed with the low dielectric layer 24. At this time, $SF_6$, $NH_3$ or $CF_4$ gas is added to improve the etching profile.

Accordingly, since the etching process is performed in the vicinity of the hard mask 22 by using $O_2$ as the main etching gas, there is substantially no loss of the gate electrode 21 and the hard mask 22.

Also, there is an extended advantage in reducing the RC delay due to the use of the low dielectric material.

As described above, the SAC formation process in accordance with the present invention is proceeded by filling the spaces around the gate electrode 21 with the low dielectric layer 24 and then depositing the inter-layer insulation layer 25 thereon. The etching process with respect to the inter-layer insulation layer 25 can obtain an etching profile by using a general SAC formation process recipe and the use of $O_2$ gas for etching the low dielectric layer 24 makes it possible to perform the SAC etching process without causing the loss of the gate electrode 21 and the hard mask 22. Also, the SAC formation process becomes much simpler because the photoresist pattern 26 is also simultaneously removed with the low dielectric layer 24.

By following the preferred embodiment of the present invention, there is provided advantages in reducing losses of the gate electrode when forming the contact hole, thereby, ultimately achieving enhanced yields of semiconductor devices.

While the present invention has been described with respect to certain preferred embodiments, it will be apparent to those skilled in the art that various changes and modifications may be made without departing from the scope of the invention as defined in the following claims.

In addition, the mask used for forming the contact hole as described in the preferred embodiment of the present invention can have variously applicable types such as a hole-type or a line-type.

What is claimed is:

1. A method for fabricating a semiconductor device, comprising the steps of:

forming a plurality of conductive patterns on a substrate;

forming hard masks on the conductive patterns;

forming an organic based dielectric layer on the substrate including the conductive patterns and the hard mask;

forming an oxide based insulation layer on the organic based dielectric layer;

selectively etching the insulation layer so as to expose the organic based dielectric layer disposed between the conductive patterns; and selectively etching the exposed organic based dielectric layer to form a contact hole that exposes the surfaces of the substrate between the conductive patterns with an $O_2$ gas as a main etching gas.

2. The method as recited in claim 1, wherein the organic based dielectric layer is formed of any one substance selected from a group consisting of hybrid-organic-siloxane-polymer, silica of low dielectric constant polymers based on divinyl siloxane bis-benzocyclobutene benzocyclobutene fluorinated polyimide nanoporous polymeric materials poly arylene ether methylsilsesquioxane and polytetrafluoroethylene.

3. The method as recited in claim 2, wherein the step of forming the organic based dielectric layer includes the steps of:

depositing the organic based dielectric layer; and performing an etch back process to the organic based dielectric layer.

4. The method as recited in claim 2, wherein $SF_6$, $NH_3$ or $CF_4$ is added to the main etching gas.

5. The method as recited in claim 2, further comprising step of forming spacers on sidewalls of the hard mask and the conductive patterns.

6. The method as recited in claim 5, wherein the spacers are formed with a single layer or multi-layers of a silicon nitride film or a silicon oxide nitride film.

7. A method for fabricating a semiconductor device, comprising the steps of:

forming a plurality of conductive patterns on a substrate;

forming hard masks on the conductive patterns;

forming an organic based dielectric layer on the substrate including the conductive patterns and the hard mask;

forming an oxide based insulation layer on the organic based dielectric layer;

forming a photoresist pattern defining contact holes on the insulation layer;

etching the insulation layer by using the photoresist pattern as an etching mask so as to expose the organic based dielectric layer disposed between the conductive patterns; and etching selectively the exposed organic based dielectric layer to form a contact hole that exposes the surfaces of the substrate between the conductive patterns with an $O_2$ gas as a main etching gas and simultaneously removing the photoresist patterns.

8. The method as recited in claim 7, wherein the organic based dielectric layer is formed of any one substance selected from a group consisting of hybrid-organic-siloxane-polymer, silica of low dielectric constant polymers based on divinyl siloxane bis-benzocyclobutene benzocyclobutene bis-benzocyclobutene fluorinated polyimide (FPI), nanoporous polymeric materials, poly arylene ether methylsilsesquioxane and polytetrafluorethylene.

9. The method as recited in claim 8, wherein the step of forming the organic based dielectric layer includes the steps of:

depositing the organic based dielectric layer; and performing an etch back process to the organic based dielectric layer.

10. The method as recited in claim 8, wherein $SF_6$, $NH_3$ or $CF_4$ is added to the main etching gas.

11. The method as recited in claim 8, further comprising step of forming spacers on sidewalls of the hard mask and the conductive patterns.

12. The method as recited in claim 11, wherein the spacers are formed with a single layer or multi-layers of a silicon nitride film or a silicon oxide nitride film.

* * * * *